United States Patent
Zhang et al.

(10) Patent No.: US 12,080,994 B1
(45) Date of Patent: Sep. 3, 2024

(54) HIGH-SIDE DRIVER METHOD AND DEVICE FOR A LASER OF A LIDAR

(71) Applicant: PHOTONIC TECHNOLOGIES (SHENZHEN) CO., LTD., Shanghai (CN)

(72) Inventors: Xudong Zhang, Shanghai (CN); Xuefeng Chen, Shanghai (CN); Xu Yang, Shanghai (CN); Ziang Xu, Shanghai (CN); Pei Jiang, Shanghai (CN)

(73) Assignee: PHOTONIC TECHNOLOGIES (SHENZHEN) CO., LTD., Shanghai (CN)

( * ) Notice: Subject to any disclaimer, the term of this patent is extended or adjusted under 35 U.S.C. 154(b) by 0 days.

(21) Appl. No.: 18/614,642

(22) Filed: Mar. 23, 2024

(30) Foreign Application Priority Data

Nov. 15, 2023  (CN) .......................... 202311516451.6

(51) Int. Cl.
  *H01S 5/042*    (2006.01)
  *G01S 7/484*    (2006.01)
  *H01S 5/062*    (2006.01)

(52) U.S. Cl.
  CPC ............ *H01S 5/0428* (2013.01); *G01S 7/484* (2013.01); *H01S 5/06216* (2013.01)

(58) Field of Classification Search
  CPC ..... G01S 7/484; H01S 5/0482; H01S 5/06216
  See application file for complete search history.

(56) References Cited

U.S. PATENT DOCUMENTS

| | | | |
|---|---|---|---|
| 8,571,078 B2 * | 10/2013 | Moto | H01S 5/0428 372/38.07 |
| 9,603,210 B1 * | 3/2017 | Carlen | H05B 45/56 |
| 2002/0027688 A1 | 3/2002 | Stephenson | |
| 2012/0106981 A1 * | 5/2012 | Moto | H03K 17/60 398/201 |

FOREIGN PATENT DOCUMENTS

| | | |
|---|---|---|
| CN | 1734912 A | 2/2006 |
| CN | 101588014 A | 11/2009 |
| CN | 108988954 A | 12/2018 |
| CN | 110212405 A | 9/2019 |
| CN | 114076926 A | 2/2022 |
| CN | 114076931 A | 2/2022 |
| CN | 114076932 A | 2/2022 |
| CN | 114185052 A | 3/2022 |
| WO | 2023165107 A1 | 9/2023 |

OTHER PUBLICATIONS

Office of Earlier Examination for Chinese Application No. CN 2023115164516 dated Jan. 8, 2024.

* cited by examiner

*Primary Examiner* — Michael Carter
(74) *Attorney, Agent, or Firm* — Renner, Otto, Boisselle & Sklar, LLP.

(57) ABSTRACT

A high-side driver method for a laser of a Lidar, including: transforming a first input signal into a second input signal between a first voltage value and a second voltage value, by a level translation module; stepping down a first voltage signal according to a first voltage difference to obtain a second voltage signal, by a low-dropout linear regulator; generating a first control signal, by the first pre-driver module; generating a pulse current for driving the laser, by the first power switching transistor.

20 Claims, 4 Drawing Sheets

HIGH-SIDE DRIVER METHOD AND DEVICE FOR A LASER OF A LIDAR

CROSS-REFERENCE TO RELATED APPLICATIONS

The present application claims priority to Chinese patent application Ser. No. CN 202311516451.6, titled "HIGH-SIDE DRIVER METHOD AND DEVICE FOR A LASER OF A LIDAR", filed on Nov. 15, 2023, which has published as CN117233733A on Dec. 15, 2023, and has issued as CN117233733B on Feb. 9, 2024, the contents of which are incorporated by reference in their entirety.

FIELD OF THE INVENTION

The present disclosure relates to the field of autonomous driving technology. More specifically, the present disclosure relates to techniques for a high-side driver method and a device for a laser of a Lidar.

BACKGROUND OF THE INVENTION

Vehicle-mounted Lidar plays an important role in the field of autonomous driving technology. Vehicle-mounted Lidar includes components such as sensors, drives, lasers, and data processing systems. The laser is driven by the driver to emit pulsed light, the sensor is used to detect the reflected light from the target, and then the data processing system calculates the distance data from the target by using algorithms such as the time-of-flight method. In order to be able to detect longer distances, and also to take into account the severe attenuation from the emitted light to the reflected light, a larger pulse current needs to be generated by the driver, such as 40 amperes, to drive the laser to emit the required pulsed light. In the prior art, gallium nitride (GaN) devices are used to form a driver to generate a pulse current to drive the laser. However, GaN devices have a large module area and can only be used as an N-type device with another pre-driver chip to form a drive scheme, so discrete components need to be cascaded, resulting in poor signal quality and poor signal integrity. In addition, GaN devices can only be driven in the low-side mode, which means that the ground wire needs to be closed to enable the drive. At present, a common laser is the Vertical-Cavity Surface-Emitting Laser (VCSEL). In the structure of VCSELs, the cathode occupies the entire area of the dorsal surface and the anode leads out from the front. As a result, GaN drivers used to drive vertical cavity surface-emitting lasers require the anode to be wired and the cathode to be extracted, which creates a barrier to the wiring layout and is not conducive to the use of mature silicon-based integration processes, resulting in higher manufacturing costs and lower levels of integration.

Accordingly, the present disclosure provides a high-side driver method and a device for a laser of a Lidar, in order for solving the technical problems in the prior art.

SUMMARY OF THE INVENTION

In accordance with a first aspect of the present disclosure, a high-side driver method for a laser of a Lidar is provided. The high-side driver method includes: transforming a first input signal into a second input signal between a first voltage value and a second voltage value, by a level translation module, the difference by the first voltage value minus the second voltage value is a reference voltage value, the second input signal is coupled to input end of a first pre-driver module; stepping down a first voltage signal according to a first voltage difference to obtain a second voltage signal, by a low-dropout linear regulator, the first voltage difference equals the reference voltage value, the second voltage signal is coupled to ground end of the first pre-driver module, the first voltage signal is used for biasing the first pre-driver module and the expected value of the first voltage signal is the first voltage value; generating a first control signal, by the first pre-driver module, the first control signal is coupled to control end of a first power switching transistor, the first voltage signal is used for biasing the first power switching transistor; generating a pulse current for driving the laser, by the first power switching transistor.

With reference to the first aspect of the present disclosure, it is realized that the first power switching transistor is driven in high-side driver mode to generate the pulse current for driving the laser, which not only provides high speed and high current to help achieve a longer detection distance and better signal-to-noise ratio, but also uses a non-GaN device to form a driving scheme to better adapt to the vertical cavity surface emission laser and better apply the BCD technology and other mature silicon-based integration processes to reduce costs and simplify layout. In addition, by using the level translation module and the low-dropout linear regulator and the setting based on the reference voltage value, controlling and biasing with respect to the first pre-driver module as well as controlling and biasing with respect to the first power switching transistor are optimized, which is beneficial to achieving high-frequency jitter following, conducive to high-quality, high-stability, high-speed, high-current signals for driving lasers in application scenarios such as vehicle-mounted Lidar and autonomous driving.

In accordance with the first aspect of the present disclosure, in a manner of implementation, the level translation module includes an adjustable resistor. The adjustable resistor is coupled between the first voltage signal and input end of the first pre-driver module, resistance value of the adjustable resistor is determined based on capacitance value of a first capacitor and half-wave pulse width of the first input signal, the first capacitor is parasitic capacitor from input end of the first pre-driver module to the ground.

In accordance with the first aspect of the present disclosure, in a manner of implementation, a resistance capacitance time constant, which is constituted by the resistance value of the adjustable resistor and the capacitance value of the first capacitor together, is not more than one-tenth of the half-wave pulse width of the first input signal.

In accordance with the first aspect of the present disclosure, in a manner of implementation, jitter of the first voltage signal is transmitted to input end of the first pre-driver module through the adjustable resistor.

In accordance with the first aspect of the present disclosure, in a manner of implementation, the level translation module further includes an adjustable current source. Output current of the adjustable current source passes through the adjustable resistor such that voltage drop on the adjustable resistor is the reference voltage value.

In accordance with the first aspect of the present disclosure, in a manner of implementation, the high-side driver method further includes: pulling down voltage of load end of the first power switching transistor based on the first input signal, by an active pull-down module, so as for improving rising edge and falling edge of optical pulse waveform generated by the laser.

In accordance with the first aspect of the present disclosure, in a manner of implementation, the active pull-down module includes a delay module, an OR logic gate, a second pre-driver module, and a second power switching transistor. Pulling down voltage of the load end of the first power switching transistor based on the first input signal, by the active pull-down module, includes: delaying the first input signal to obtain a delayed first input signal, by the delay module; performing a logical OR operation on the first input signal and the delayed first input signal to obtain a third input signal, by the OR logic gate, the third input signal is coupled to input end of the second pre-driver module, the bias voltage for the second pre-driver module is the reference voltage value, ground end of the second pre-driver module is directly connected to the ground; generating a second control signal, by the second pre-driver module, the second control signal is coupled to control end of a second power switching transistor, the voltage of the load end of the first power switching transistor is used for biasing the second power switching transistor; generating a current for pulling down the voltage of the load end of the first power switching transistor, by the second power switching transistor, the type of the second power switching transistor is opposite to the type of the first power switching transistor.

In accordance with the first aspect of the present disclosure, in a manner of implementation, the second pre-driver module drives the second power switching transistor in a low-side driver mode, the first pre-driver module drives the first power switching transistor in a high-side driver mode.

In accordance with the first aspect of the present disclosure, in a manner of implementation, when the first power switching transistor is an N-type transistor, the second power switching transistor is a P-type transistor, or, when the first power switching transistor is a P-type transistor, the second power switching transistor is an N-type transistor.

In accordance with the first aspect of the present disclosure, in a manner of implementation, the reference voltage value is maximum tolerable voltage difference of the first power switching transistor.

In accordance with the first aspect of the present disclosure, in a manner of implementation, the Lidar is for a vehicle-mounted implementation, and the first voltage signal is a vehicle battery voltage.

In accordance with the first aspect of the present disclosure, in a manner of implementation, the first power switching transistor is a P-type LDMOS (Laterally Diffused Metal Oxide Semiconductor) or an N-type LDMOS.

In accordance with the first aspect of the present disclosure, in a manner of implementation, the first power switching transistor is a non-GaN device and is manufacturable by BCD (Bipolar-CMOS-DMOS) technology.

In accordance with a second aspect of the present disclosure, a high-side driver device for a laser of a Lidar is provided. The high-side driver device includes: a pulse signal receiver, for receiving an input pulse signal so as to generate a first input signal; a level translation module, for transforming the first input signal into a second input signal between a first voltage value and a second voltage value, the difference by the first voltage value minus the second voltage value is a reference voltage value, the second input signal is coupled to input end of a first pre-driver module; a low-dropout linear regulator, for stepping down a first voltage signal according to a first voltage difference to obtain a second voltage signal, the first voltage difference equals the reference voltage value, the second voltage signal is coupled to ground end of the first pre-driver module, the first voltage signal is used for biasing the first pre-driver module and the expected value of the first voltage signal is the first voltage value; the first pre-driver module, for generating a first control signal, the first control signal is coupled to control end of a first power switching transistor, the first voltage signal is used for biasing the first power switching transistor; the first power switching transistor, for generating a pulse current for driving the laser.

With reference to the second aspect of the present disclosure, it is realized that the first power switching transistor is driven in high-side driver mode to generate the pulse current for driving the laser, which not only provides high speed and high current to help achieve a longer detection distance and better signal-to-noise ratio, but also uses a non-GaN device to form a driving scheme to better adapt to the vertical cavity surface emission laser and better apply the BCD technology and other mature silicon-based integration processes to reduce costs and simplify layout. In addition, by using the level translation module and the low-dropout linear regulator and the setting based on the reference voltage value, controlling and biasing with respect to the first pre-driver module as well as controlling and biasing with respect to the first power switching transistor are optimized, which is beneficial to achieving high-frequency jitter following, conducive to high-quality, high-stability, high-speed, high-current signals for driving lasers in application scenarios such as vehicle-mounted Lidar and autonomous driving.

In accordance with the second aspect of the present disclosure, in a manner of implementation, the level translation module includes an adjustable resistor. The adjustable resistor is coupled between the first voltage signal and input end of the first pre-driver module, resistance value of the adjustable resistor is determined based on capacitance value of a first capacitor and half-wave pulse width of the first input signal, the first capacitor is parasitic capacitor from input end of the first pre-driver module to the ground, jitter of the first voltage signal is transmitted to input end of the first pre-driver module through the adjustable resistor.

In accordance with the second aspect of the present disclosure, in a manner of implementation, the high-side driver device further includes an active pull-down module. The active pull-down module is configured for: pulling down voltage of load end of the first power switching transistor based on the first input signal, so as for improving rising edge and falling edge of optical pulse waveform generated by the laser.

In accordance with the second aspect of the present disclosure, in a manner of implementation, the active pull-down module includes a delay module, an OR logic gate, a second pre-driver module, and a second power switching transistor. The delay module is configured for delaying the first input signal to obtain a delayed first input signal, the OR logic gate is configured for performing a logical OR operation on the first input signal and the delayed first input signal to obtain a third input signal, the third input signal is coupled to input end of the second pre-driver module, the bias voltage for the second pre-driver module is the reference voltage value, ground end of the second pre-driver module is directly connected to the ground, the second pre-driver module is configured for generating a second control signal, the second control signal is coupled to control end of a second power switching transistor, the voltage of the load end of the first power switching transistor is used for biasing the second power switching transistor, the second power switching transistor is configured for generating a current for pulling down the voltage of the load end of the first power switching transistor, the type of the second power switching transistor is opposite to the type of the first power switching transistor.

BRIEF DESCRIPTION OF THE DRAWINGS

The drawings are provided to illustrate example embodiments described herein and are not intended to limit the scope of the present disclosure.

DETAILED DESCRIPTION

Figure 1:
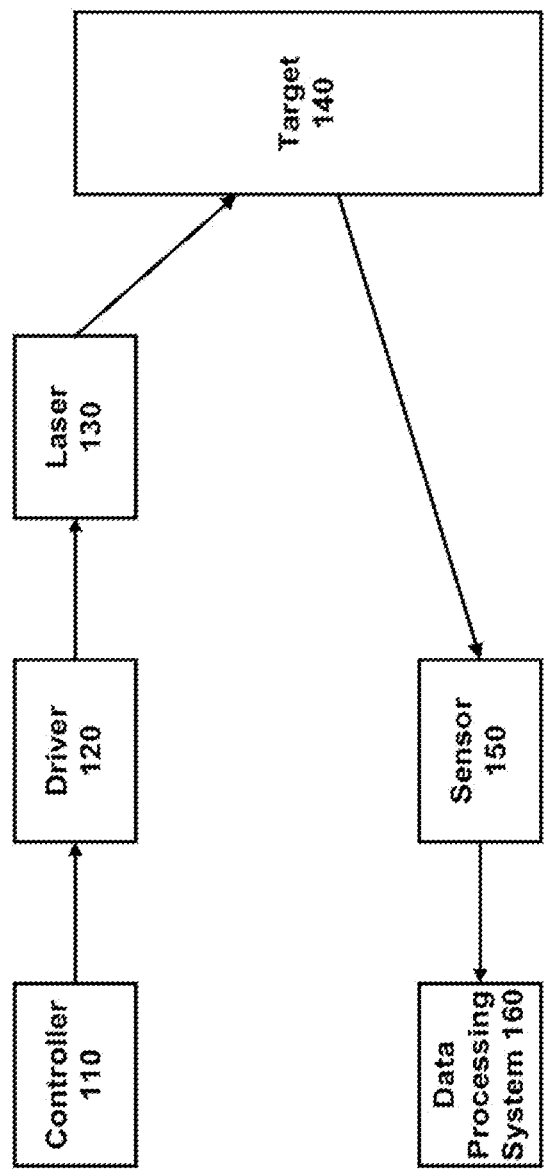
FIG. 1 illustrates an exemplary Lidar system.

FIG. 1 illustrates an exemplary Lidar system. As shown in FIG. 1, the Lidar (Light Detection And Ranging) system includes a controller 110, a driver 120, a laser 130, a sensor 150 and a data processing system 160. The controller 110 controls the driver 120 to generate a pulse current, and then uses the pulse current to drive the laser 130 to emit a pulsed light. The emitted light after the laser 130 emits light to the target 140 is received by the sensor 150, thereby obtaining information such as photon flight time, and then distance data is obtained by the calculation of the data processing system 160, so that the distance between the Lidar system and the target 140 can be determined. In the application scenario of autonomous driving, the vehicle-mounted Lidar system is used to detect the distance of each target within the detection range, and can also be used to generate laser point cloud maps, so it occupies an important position. In order to be able to probe longer distances, the driver 120 is required to generate a larger pulse current, such as 40 amps. In addition, after the light emitted by the laser 130 is reflected by the target, there is a very serious attenuation, that is, the intensity of the reflected light detected by the sensor 150 is generally far less than the intensity of the emitted light. In order to improve the detection accuracy and improve the signal-to-noise ratio, the driver 120 also needs to generate a larger pulse current in order to drive the laser 130 to emit the pulse light that meets the requirements. The basic structure of the driver 120 consists of a pre-drive module and a high-power switch. The high-power switch has a high switching frequency, which can achieve high-frequency switching operation to provide high-frequency pulse current. The laser 130 can be a laser diode, which generates a high-frequency pulsed light under the action of a high-frequency pulse current. The pre-drive module and the high-power switch together form a drive scheme, and the pre-drive module provides the control signal to control the high-power switch to carry out high-frequency switching operations. When gallium nitride (GaN) devices are used for high-power switches, it is difficult to make P-type devices due to the elemental characteristics of GaN devices, and only N-type devices can be used to form the drive scheme. Therefore, the driving scheme of the laser of Lidar using GaN devices requires N-type devices based on GaN technology and pre-driver chips based on CMOS (Complementary Metal Oxide Semiconductor) technology to form a driving scheme, which leads to the cascade of discrete devices, that is, two discrete chips, which makes the signal quality and integrity poor, and will also occupy a larger area. In addition, for common lasers such as VCSEL (Vertical-Cavity Surface-Emitting Laser), it is difficult for Lidar using GaN devices to adapt well to vertical cavity surface-emitting lasers. In the structure of a vertical-cavity surface-emitting laser, the cathode occupies the entire area of the back and the anode leads out from the front. For Lidar using gallium nitride devices, because only N-type devices based on gallium nitride technology can be used, so it can only adopt a low-side drive mode, that is, the drive is enabled by closing the ground wire, which means that in order to drive the vertical cavity surface emitting laser, the anode needs to be tied and the cathode needs to be extracted, which brings obstacles to the wiring layout of the chip, and is not conducive to the use of mature silicon-based integration processes, so it leads to higher manufacturing costs and lower integration. Therefore, Lidar using GaN devices requires discrete device cascade and GaN process, which is difficult to adapt to mainstream lasers such as vertical cavity surface-emitting lasers, and it is difficult to apply mature and highly integrated silicon-based integration processes such as BCD (Bipolar-CMOS-DMOS) process, thereby having defects such as high cost, complex layout, and poor signal quality. In light of above, exemplary embodiments of the present disclosure provide a high-side driver method and a device for a laser of a Lidar, such as for the driver 120 of the Lidar of FIG. 1, which has the technical benefits of realizing the driving scheme of non-gallium nitride devices, better adapting to vertical cavity surface emitting lasers, capable of integrating pre-driver chips and other functional modules, simplifying the layout of modules, having a better level of integration, and capable of implementing mature silicon-based integration processes such as BCD technology, having advantages of low cost, simplified layout, good signal quality, high level integration, which will be further described below.

Figure 2:
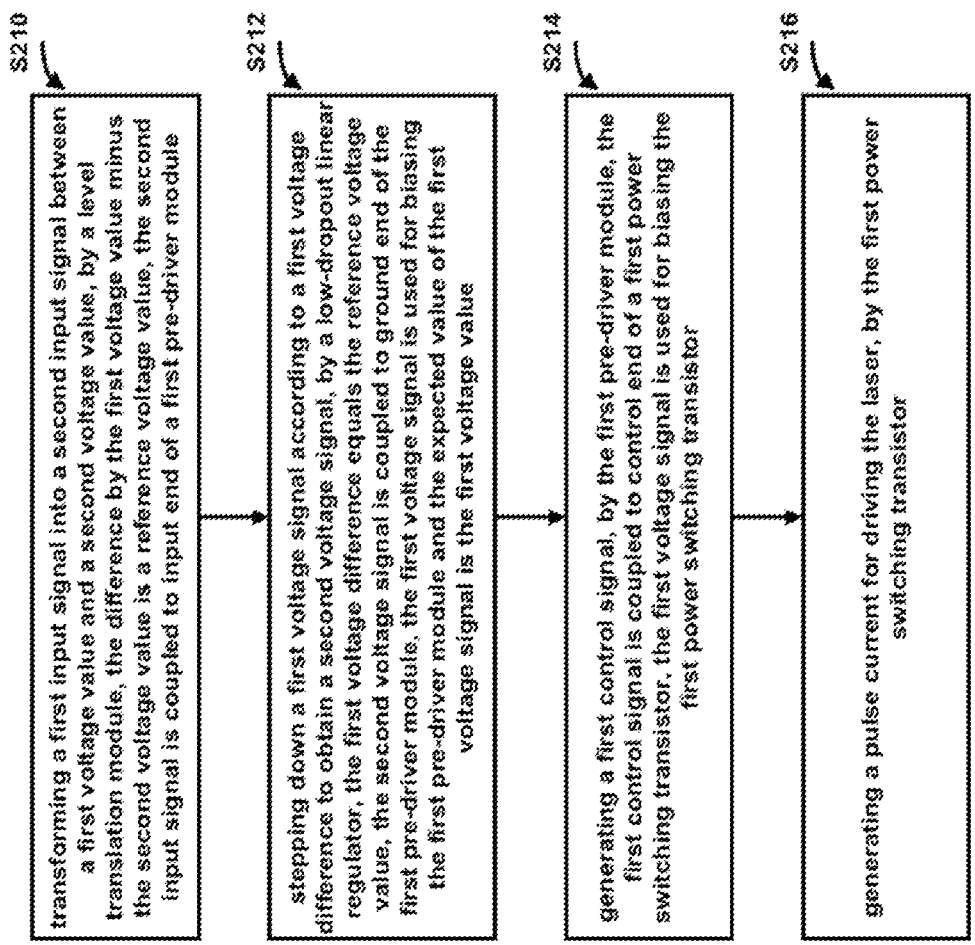
FIG. 2 illustrates a schematic diagram of a flow chart of a high-side driver method for a laser of a Lidar.

FIG. 2 illustrates a schematic diagram of a flow chart of a high-side driver method for a laser of a Lidar. According to FIG. 2, the high-side driver method has following steps.

Step S210: transforming a first input signal into a second input signal between a first voltage value and a second voltage value, by a level translation module, the difference by the first voltage value minus the second voltage value is a reference voltage value, the second input signal is coupled to input end of a first pre-driver module.

Step S212: stepping down a first voltage signal according to a first voltage difference to obtain a second voltage signal, by a low-dropout linear regulator, the first voltage difference equals the reference voltage value, the second voltage signal is coupled to ground end of the first pre-driver module, the first voltage signal is used for biasing the first pre-driver module and the expected value of the first voltage signal is the first voltage value.

Step S214: generating a first control signal, by the first pre-driver module, the first control signal is coupled to control end of a first power switching transistor, the first voltage signal is used for biasing the first power switching transistor.

Step S216: generating a pulse current for driving the laser, by the first power switching transistor.

Referring to FIG. 2 and above steps, at step S210, transforming a first input signal into a second input signal between a first voltage value and a second voltage value, by a level translation module. Here, the first input signal can be obtained from the pulse input signal received by Lidar. For example, a pulse input signal can be a pulse signal that varies between 0 and 3.3 volts, and Lidar can include a pulse signal receiver that receives the pulse input signal and converts it into a first input signal of 0 to 5 volts. Signal integrity is ensured by the level translation module, where the second input signal is coupled to the input end of the first pre-driver module, and the second input signal is used to control the first pre-driver module to further drive the first power switching transistor to generate the desired pulse current. Here, the range of variation of the second input signal is between the first voltage value and the second voltage value, that is, the maximum voltage value of the second input signal is the first voltage value and the minimum voltage value is the second voltage value. Also, the difference by the first voltage value minus the second voltage value is a reference voltage value. At step S212, by way of the low-dropout linear regulator, it is achieved that an output voltage with low dropout voltage and stable output voltage at a fixed value in the linear operating state, i.e., stepping down a first voltage signal according to a first voltage difference to obtain a second voltage signal. Here, the first voltage difference equals the reference voltage value, and the first voltage signal is used for biasing the first pre-driver module. The expected value of the first voltage signal is the first voltage value. In practical implementations, due to the influence of jitter and other factors, there may be a certain deviation between the actual value of the first voltage signal and the expected first voltage value. As such, by way of the level translation module and the low-dropout linear regulator, it is achieved that the control signal and bias state of the first pre-driver module may be configured, including using the level translation module to generate the second input signal (between the first voltage value and the second voltage value) that is coupled to the input end of the first pre-driver module, and using the low-dropout linear regulator to generate the second voltage signal that is coupled to the ground end of the first pre-driver module, and the first voltage signal is used for biasing the first pre-driver module. As such, by defining the variation scope of the second input signal as between the first voltage value and the second voltage value, while, the difference between the first voltage value and the second voltage value is the reference voltage value, and by requiring that stepping down the first voltage signal according to the first voltage difference to obtain the second voltage signal, while, the first voltage difference equals the reference voltage value; therefore, on one hand, it is helpful to realize the drive scheme of high-side driver mode, that is, the drive is enabled by closing the switch on the power line, and the change amplitude of the second input signal is set based on the reference voltage value (between the first voltage value and the second voltage value, and the difference between the first voltage value and the second voltage is the reference voltage value), so as to control the first pre-driver module with the second input signal. Also, the second voltage signal is set based on the reference voltage value (stepping down the first voltage signal according to the first voltage difference to obtain the second voltage signal, and, the first voltage difference equals the reference voltage value), so as to use the second voltage signal as the equivalent ground end voltage of the first pre-driver module, such that in combination with using the first voltage signal as the bias voltage of the first pre-driver module, it is enabled that the first pre-driver module not only operates in the high-side driver mode under the bias effect of the first voltage signal, but also flexibly responds to factors that may exist in actual implementations such as jitter, in other words, capable of overcoming the interference caused by the deviation of the first voltage signal relative to the first voltage value as the expected value in actual implementations. In practical applications such as vehicle-mounted Lidar, within a drive scheme of high-side driver mode, the first voltage signal that is used to bias the first pre-driver module, is generally accessible to the highest voltage of the on-board system, e.g. the on-board battery voltage. Affected by factors such as battery aging and power supply line aging, the voltage provided by the on-board battery to Lidar may have jitters, which may include high-frequency, low-frequency, and different frequency combinations, which may affect the conduction and shutdown of the power switching transistor, thereby interfering with the laser to generate pulsed light signals. By using the level translation module and the low-dropout linear regulator, it is achieved that the control signal and bias state of the first pre-driver module may be configured, while taking into account jitter of the first voltage signal, by using the low-dropout linear regulator to generate the second voltage signal that is coupled to the ground end of the first pre-driver module, and by using the first voltage signal to bias the first pre-driver module, thereby beneficial to achieving high-frequency jitter following, and the equivalent ground end voltage of the first pre-driver module can follow the change of the on-board battery voltage, which is conducive to ensuring the quality and stability of the high-speed and high-current signals used to drive the laser.

Still referring to FIG. 2, at step S214, generating the first control signal, by the first pre-driver module. The first control signal is coupled to control end of the first power switching transistor, the first voltage signal is used for biasing the first power switching transistor. At step S216, generating a pulse current for driving the laser, by the first power switching transistor. By using the level translation module and the low-dropout linear regulator, it is achieved that the control signal and bias state of the first pre-driver module may be configured, including using the level translation module to generate the second input signal (between the first voltage value and the second voltage value) that is coupled to the input end of the first pre-driver module. As such, by using the first pre-driver module to generate the first control signal for controlling turn-on and turn-off of the first power switching transistor, and by using the first voltage signal to bias the first power switching transistor, it is beneficial to achieving the high-frequency jitter following with respect to the first voltage signal, thereby helping to ensure that the first power switching transistor is switched between turn-on and turn-off according to the input pulse signal, so as to generate high-quality, stable, high-speed, high-current signals used to drive the laser in the subsequent stage to output optical pulse signals. It should be understood that the first pre-driver module may take any suitable circuit, hardware, device, module, etc., with signal processing capabilities, as long as it may generate the first control signal for controlling turn-on and turn-off of the first power switching transistor, based on the second input signal.

In sum, in accordance with the high-side driver method for a laser of a Lidar as shown in FIG. 2, it is realized that the first power switching transistor is driven in high-side driver mode to generate the pulse current for driving the laser, which not only provides high speed and high current to help achieve a longer detection distance and better signal-to-noise ratio, but also uses a non-GaN device to form a driving scheme to better adapt to the vertical cavity surface emission laser and better apply the BCD technology and other mature silicon-based integration processes to reduce costs and simplify layout. In addition, by using the level translation module and the low-dropout linear regulator and the setting based on the reference voltage value, controlling and biasing with respect to the first pre-driver module as well as controlling and biasing with respect to the first power switching transistor are optimized, which is beneficial to achieving high-frequency jitter following, conducive to high-quality, high-stability, high-speed, high-current signals for driving lasers in application scenarios such as vehicle-mounted Lidar and autonomous driving.

In a manner of implementation, the level translation module includes an adjustable resistor. The adjustable resistor is coupled between the first voltage signal and input end of the first pre-driver module, resistance value of the adjustable resistor is determined based on capacitance value of a first capacitor and half-wave pulse width of the first input signal, the first capacitor is parasitic capacitor from input end of the first pre-driver module to the ground. In some exemplary embodiments, a resistance capacitance time constant, which is constituted by the resistance value of the adjustable resistor and the capacitance value of the first capacitor together, is not more than one-tenth of the half-wave pulse width of the first input signal. In some exemplary embodiments, jitter of the first voltage signal is transmitted to input end of the first pre-driver module through the adjustable resistor. In some exemplary embodiments, the level translation module further includes an adjustable current source. Output current of the adjustable current source passes through the adjustable resistor such that voltage drop on the adjustable resistor is the reference voltage value. Accordingly, by using the adjustable resistor of the level translation module, it is achieved that jitter of the first voltage signal is transmitted to input end of the first pre-driver module through the adjustable resistor, therefore, in combination with using the low-dropout linear regulator to generate the second voltage signal that is coupled to the ground end of the first pre-driver module, and with using the first voltage signal to bias the first pre-driver module, thereby beneficial to achieving high-frequency jitter following, and the equivalent ground end voltage of the first pre-driver module can follow the change of the on-board battery voltage in implementations such as vehicle-mounted Lidar, which is conducive to ensuring the quality and stability of the high-speed and high-current signals used to drive the laser. Also, the resistance value of the adjustable resistor is determined based on the capacitance value of a first capacitor and the half-wave pulse width of the first input signal, while, the first capacitor is parasitic capacitor from input end of the first pre-driver module to the ground. As such, the first capacitor is the capacitance of the input node in high-side driver mode, and the capacitance value of the first capacitor under different process conditions can be determined by simulation. Considering the influence of the process conditions of the Lidar chip, in order to ensure that the high-speed and high-current signals used to drive the laser can be generated under various process conditions, with reference to the capacitance value of the first capacitor determined by simulation under various process conditions and the half-wave pulse width of the first input signal, the resistance value of the adjustable resistor may be adjusted, such that the resistance capacitance time constant is not more than one-tenth of the half-wave pulse width of the first input signal, helping to ensure signal integrity over a wide range of process conditions. Further, in addition to determining the resistance value of the adjustable resistor based on the capacitance value of the first capacitor and half-wave pulse width of the first input signal, the adjustable current source is provided, and output current of the adjustable current source passes through the adjustable resistor such that voltage drop on the adjustable resistor is the reference voltage value. Accordingly, on one hand, using the adjustable resistor to realize high-frequency jitter following, and on the other hand, using the adjustable resistor and the adjustable current source to realize that the influence of parasitic capacitance may be overcome under various process conditions, so as to generate high-speed, high-current signals for driving the laser, which is conducive to improving signal integrity.

In a manner of implementation, the high-side driver method further includes: pulling down voltage of load end of the first power switching transistor based on the first input signal, by an active pull-down module, so as for improving rising edge and falling edge of optical pulse waveform generated by the laser. The low-side drive scheme requires the ground wire to be closed, so an active pull-down to improve the waveform is not possible. A high-side driver method for a laser of a Lidar shown in FIG. 2, implements a high-side driver mode to drive the first power switching transistor to generate a pulse current for driving the laser, so that the active pull-down module may be used to improve the rising and falling waveform of the output optical pulse of the laser, so as to effectively improve the tailing phenomenon of the laser pulse.

In a manner of implementation, the active pull-down module includes a delay module, an OR logic gate, a second pre-driver module, and a second power switching transistor. Pulling down voltage of the load end of the first power switching transistor based on the first input signal, by the active pull-down module, includes: delaying the first input signal to obtain a delayed first input signal, by the delay module; performing a logical OR operation on the first input signal and the delayed first input signal to obtain a third input signal, by the OR logic gate, the third input signal is coupled to input end of the second pre-driver module, the bias voltage for the second pre-driver module is the reference voltage value, ground end of the second pre-driver module is directly connected to the ground; generating a second control signal, by the second pre-driver module, the second control signal is coupled to control end of a second power switching transistor, the voltage of the load end of the first power switching transistor is used for biasing the second power switching transistor; generating a current for pulling down the voltage of the load end of the first power switching transistor, by the second power switching transistor, the type of the second power switching transistor is opposite to the type of the first power switching transistor. Accordingly, by using the active pull-down module to delay the first input signal, then performing a logical OR operation with the first input signal, the third input signal thus obtained is used to generate the second control signal by the second pre-driver module, and the second control signal is used to drive the second power switching transistor, so as to generate a current for pulling down. Here, the type of the second power switching transistor is opposite to the type of the first power switching transistor, and, the ground end of the second pre-driver module is directly connected to the ground. In some exemplary embodiments, the second pre-driver module drives the second power switching transistor in a low-side driver mode, the first pre-driver module drives the first power switching transistor in a high-side driver mode. In some exemplary embodiments, when the first power switching transistor is an N-type transistor, the second power switching transistor is a P-type transistor, or, when the first power switching transistor is a P-type transistor, the second power switching transistor is an N-type transistor. Accordingly, by using the first pre-driver module to drive the first power switching transistor in a high-side driver mode to generate the pulse current for driving the laser, and by using the second pre-driver module to drive the second power switching transistor in a low-side driver mode to generate the current for pulling down, and, the type of the second power switching transistor is opposite to the type of the first power switching transistor, and, the bias voltage for the second pre-driver module is the reference voltage value, thereby improving the rising and falling waveform of the output optical pulse of the laser, so as to effectively improve the tailing phenomenon of the laser pulse.

In a manner of implementation, the reference voltage value is maximum tolerable voltage difference of the first power switching transistor. The maximum tolerable voltage difference of the first power switching transistor represents the burnout limit of the transistor. By setting the reference voltage value to the maximum tolerable voltage difference of the first power switching transistor, it is beneficial to make full use of the first power switching transistor's device features and performance to generate the highest possible high speed, high current, resulting in longer detection range and higher signal-to-noise ratio of Lidar. In some embodiments, the received pulse input signal can be converted into the first input signal by a pulse signal receiver. In addition, in order to combine with a level translator in order to take full advantage of the maximum tolerable voltage difference of the first power switching transistor and thus provide the largest possible high frequency and high current, the amplitude of the first input signal provided by the pulse signal receiver can be set to based on the reference voltage value. For example, if the maximum tolerable voltage difference of the first power switching transistor is 5 volts, one may set the first input signal to vary from 0 to 5 volts.

In a manner of implementation, the Lidar is for a vehicle-mounted implementation, and the first voltage signal is a vehicle battery voltage. In practical applications such as vehicle-mounted Lidar, within a drive scheme of high-side driver mode, the first voltage signal that is used to bias the first pre-driver module, is generally accessible to the highest voltage of the on-board system, e.g. the on-board battery voltage. Affected by factors such as battery aging and power supply line aging, the voltage provided by the on-board battery to Lidar may have jitters, which may include high-frequency, low-frequency, and different frequency combinations, which may affect the conduction and shutdown of the power switching transistor, thereby interfering with the laser to generate pulsed light signals. By using the level translation module and the low-dropout linear regulator, it is achieved that the control signal and bias state of the first pre-driver module may be configured, while taking into account jitter of the first voltage signal, by using the low-dropout linear regulator to generate the second voltage signal that is coupled to the ground end of the first pre-driver module, and by using the first voltage signal to bias the first pre-driver module, thereby beneficial to achieving high-frequency jitter following, and the equivalent ground end voltage of the first pre-driver module can follow the change of the on-board battery voltage, which is conducive to ensuring the quality and stability of the high-speed and high-current signals used to drive the laser.

In a manner of implementation, the first power switching transistor is a P-type LDMOS or an N-type LDMOS. Accordingly, P-type LDMOS or N-type LDMOS may be used, which also called horizontal diffusion FETs. LDMOS eliminates the drain on the back and is more easily compatible with other silicon-based integration processes, which helps to simplify layout and improve chip integration.

In a manner of implementation, the first power switching transistor is a non-GaN device and is manufacturable by BCD technology. As mentioned above, Lidar using GaN devices requires discrete device cascade and GaN process, which is difficult to adapt to mainstream lasers such as vertical cavity surface-emitting lasers, and it is difficult to apply mature and highly integrated silicon-based integration processes such as BCD process, thereby having defects such as high cost, complex layout, and poor signal quality. The high-side driver method and the device for a laser of a Lidar provided by detailed embodiments of the present disclosure, has the technical benefits of realizing the driving scheme of non-gallium nitride devices, better adapting to vertical cavity surface emitting lasers, capable of integrating pre-driver chips and other functional modules, simplifying the layout of modules, having a better level of integration, and capable of implementing mature silicon-based integration processes such as BCD technology, having advantages of low cost, simplified layout, good signal quality, high level integration.

Figure 3:
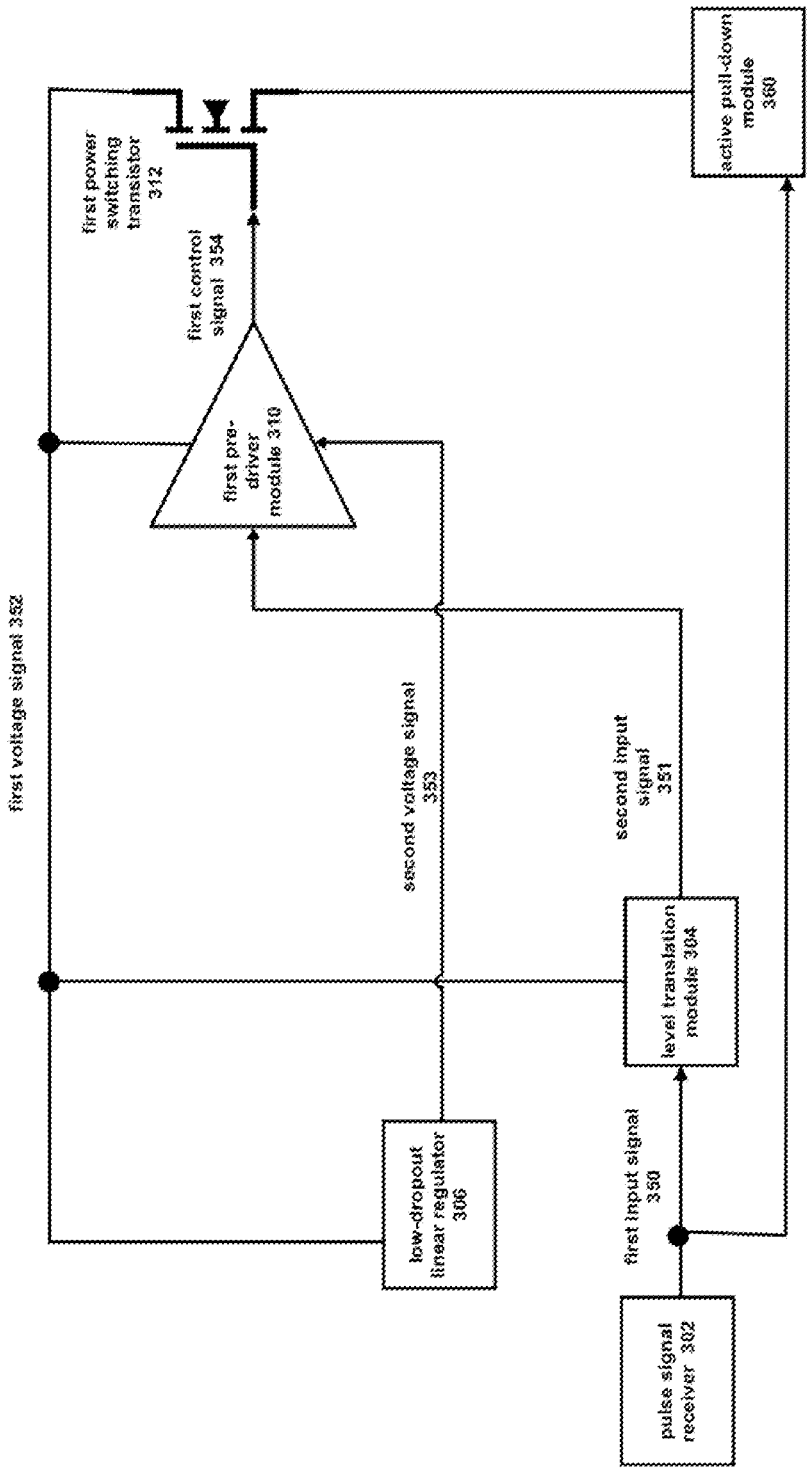
FIG. 3 illustrates a schematic diagram of a high-side driver device for a laser of a Lidar in accordance with a first implementation manner.

FIG. 3 illustrates a schematic diagram of a high-side driver device for a laser of a Lidar in accordance with a first implementation manner. As shown in FIG. 3, the high-side driver device includes a pulse signal receiver 302, for receiving an input pulse signal so as to generate a first input signal 350; a level translation module 304, for transforming the first input signal 350 into a second input signal 351 between a first voltage value and a second voltage value. The difference by the first voltage value minus the second voltage value is a reference voltage value, the second input signal 351 is coupled to input end of a first pre-driver module 310. The high-side driver device also includes a low-dropout linear regulator 306, for stepping down a first voltage signal 352 according to a first voltage difference to obtain a second voltage signal 353. The first voltage difference equals the reference voltage value. The second voltage signal 353 is coupled to ground end of the first pre-driver module 310. The first voltage signal 352 is used for biasing the first pre-driver module 310 and the expected value of the first voltage signal 352 is the first voltage value. The high-side driver device also includes the first pre-driver module 310, for generating a first control signal 354. The first control signal 354 is coupled to control end of a first power switching transistor 312, the first voltage signal 352 is used for biasing the first power switching transistor 312. The high-side driver device also includes the first power switching transistor 312, for generating a pulse current for driving the laser.

In accordance with the high-side driver device for a laser of a Lidar as shown in FIG. 3, it is realized that the first power switching transistor 312 is driven in high-side driver mode to generate the pulse current for driving the laser, which not only provides high speed and high current to help achieve a longer detection distance and better signal-to-noise ratio, but also uses a non-GaN device to form a driving scheme to better adapt to the vertical cavity surface emission laser and better apply the BCD technology and other mature silicon-based integration processes to reduce costs and simplify layout. In addition, by using the level translation module 304 and the low-dropout linear regulator 306 and the setting based on the reference voltage value, controlling and biasing with respect to the first pre-driver module 310 as well as controlling and biasing with respect to the first power switching transistor 312 are optimized, which is beneficial to achieving high-frequency jitter following, conducive to high-quality, high-stability, high-speed, high-current signals for driving lasers in application scenarios such as vehicle-mounted Lidar and autonomous driving.

In a manner of implementation, the high-side driver device further includes an active pull-down module 360. The active pull-down module 360 is configured for: pulling down voltage of load end of the first power switching transistor 312 based on the first input signal 350, so as for improving rising edge and falling edge of optical pulse waveform generated by the laser. Accordingly, it implements a high-side driver mode to drive the first power switching transistor to generate a pulse current for driving the laser, so that the active pull-down module may be used to improve the rising and falling waveform of the output optical pulse of the laser, so as to effectively improve the tailing phenomenon of the laser pulse.

Figure 4:
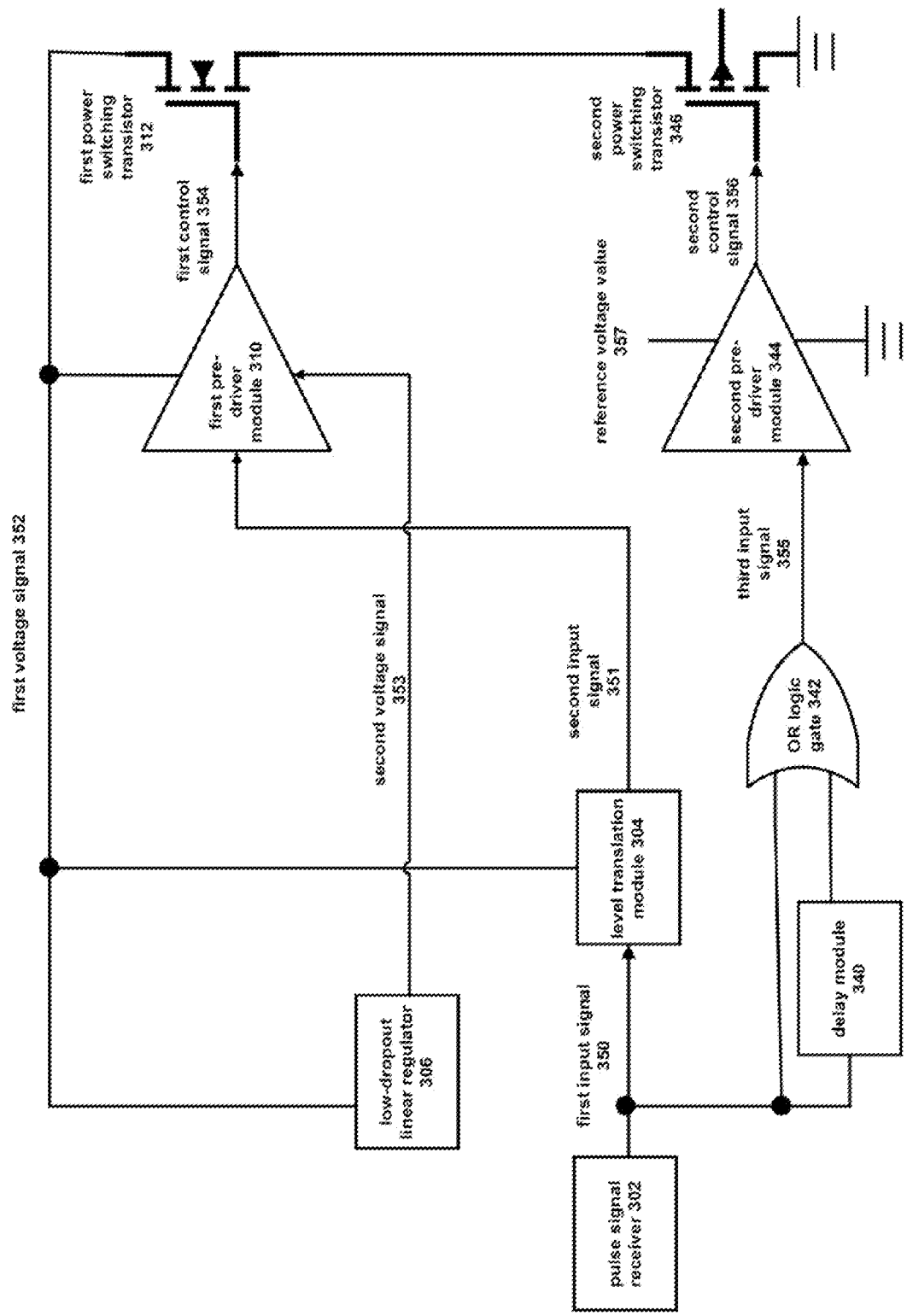
FIG. 4 illustrates a schematic diagram of a high-side driver device for a laser of a Lidar in accordance with a second implementation manner.

FIG. 4 illustrates a schematic diagram of a high-side driver device for a laser of a Lidar in accordance with a second implementation manner. Some of the elements in FIG. 4 have the same names and designations as some of the elements in FIG. 3, these are the same elements and will not be repeated here. FIG. 4 also illustrates a delay module 340, an OR logic gate 342, a second pre-driver module 344, and a second power switching transistor 346. The delay module 340 is configured for delaying the first input signal 350 to obtain a delayed first input signal, the OR logic gate 342 is configured for performing a logical OR operation on the first input signal 350 and the delayed first input signal to obtain a third input signal 355, the third input signal 355 is coupled to input end of the second pre-driver module 344, the bias voltage for the second pre-driver module 344 is the reference voltage value 357, ground end of the second pre-driver module 344 is directly connected to the ground, the second pre-driver module 344 is configured for generating a second control signal 356, the second control signal 356 is coupled to control end of a second power switching transistor 346. The voltage of the load end of the first power switching transistor 312 is used for biasing the second power switching transistor 346, the second power switching transistor 346 is configured for generating a current for pulling down the voltage of the load end of the first power switching transistor 312, the type of the second power switching transistor 346 is opposite to the type of the first power switching transistor 312.

Accordingly, by using the first pre-driver module to drive the first power switching transistor in a high-side driver mode to generate the pulse current for driving the laser, and by using the second pre-driver module to drive the second power switching transistor in a low-side driver mode to generate the current for pulling down, and, the type of the second power switching transistor is opposite to the type of the first power switching transistor, and, the bias voltage for the second pre-driver module is the reference voltage value, thereby improving the rising and falling waveform of the output optical pulse of the laser, so as to effectively improve the tailing phenomenon of the laser pulse.

It should be understood that, the types of transistors in FIG. 3 and FIG. 4 are illustrative only. In some embodiments, the first power switching transistor 312 is a P-type LDMOS or an N-type LDMOS. As such, a P-type LDMOS or an N-type LDMOS can be used, which are more easily compatible with other silicon-based integration processes, which helps to simplify the layout and improve the integration of chips.

With reference to FIG. 1, FIG. 2, FIG. 3, and FIG. 4, in a manner of implementation, a Lidar includes a laser and a high-side driver device for the laser. The high-side driver device includes: a pulse signal receiver, for receiving an input pulse signal so as to generate a first input signal; a level translation module, for transforming the first input signal into a second input signal between a first voltage value and a second voltage value, the difference by the first voltage value minus the second voltage value is a reference voltage value, the second input signal is coupled to input end of a first pre-driver module; a low-dropout linear regulator, for stepping down a first voltage signal according to a first voltage difference to obtain a second voltage signal, the first voltage difference equals the reference voltage value, the second voltage signal is coupled to ground end of the first pre-driver module, the first voltage signal is used for biasing the first pre-driver module and the expected value of the first voltage signal is the first voltage value; the first pre-driver module, for generating a first control signal, the first control signal is coupled to control end of a first power switching transistor, the first voltage signal is used for biasing the first power switching transistor; the first power switching transistor, for generating a pulse current for driving the laser. The level translation module comprises an adjustable resistor, the adjustable resistor is coupled between the first voltage signal and input end of the first pre-driver module, resistance value of the adjustable resistor is determined based on capacitance value of a first capacitor and half-wave pulse width of the first input signal, the first capacitor is parasitic capacitor from input end of the first pre-driver module to the ground, jitter of the first voltage signal is transmitted to input end of the first pre-driver module through the adjustable resistor.

Accordingly, it is realized that the first power switching transistor is driven in high-side driver mode to generate the pulse current for driving the laser, which not only provides high speed and high current to help achieve a longer detection distance and better signal-to-noise ratio, but also uses a non-GaN device to form a driving scheme to better adapt to the vertical cavity surface emission laser and better apply the BCD technology and other mature silicon-based integration processes to reduce costs and simplify layout. In addition, by using the level translation module and the low-dropout linear regulator and the setting based on the reference voltage value, controlling and biasing with respect to the first pre-driver module as well as controlling and biasing with respect to the first power switching transistor are optimized, which is beneficial to achieving high-frequency jitter following, conducive to high-quality, high-stability, high-speed, high-current signals for driving lasers in application scenarios such as vehicle-mounted Lidar and autonomous driving.

In some exemplary embodiments, the high-side driver device further includes an active pull-down module. The active pull-down module is configured for: pulling down voltage of load end of the first power switching transistor based on the first input signal, so as for improving rising edge and falling edge of optical pulse waveform generated by the laser. The low-side drive scheme requires the ground wire to be closed, so an active pull-down to improve the waveform is not possible. Accordingly, it implements a high-side driver mode to drive the first power switching transistor to generate a pulse current for driving the laser, so that the active pull-down module may be used to improve the rising and falling waveform of the output optical pulse of the laser, so as to effectively improve the tailing phenomenon of the laser pulse.

In some exemplary embodiments, the active pull-down module includes a delay module, an OR logic gate, a second pre-driver module, and a second power switching transistor. The delay module is configured for delaying the first input signal to obtain a delayed first input signal, the OR logic gate is configured for performing a logical OR operation on the first input signal and the delayed first input signal to obtain a third input signal, the third input signal is coupled to input end of the second pre-driver module, the bias voltage for the second pre-driver module is the reference voltage value, ground end of the second pre-driver module is directly connected to the ground, the second pre-driver module is configured for generating a second control signal, the second control signal is coupled to control end of a second power switching transistor, the voltage of the load end of the first power switching transistor is used for biasing the second power switching transistor, the second power switching transistor is configured for generating a current for pulling down the voltage of the load end of the first power switching transistor, the type of the second power switching transistor is opposite to the type of the first power switching transistor. Accordingly, by using the active pull-down module to delay the first input signal, then performing a logical OR operation with the first input signal, the third input signal thus obtained is used to generate the second control signal by the second pre-driver module, and the second control signal is used to drive the second power switching transistor, so as to generate a current for pulling down. Here, the type of the second power switching transistor is opposite to the type of the first power switching transistor, and, the ground end of the second pre-driver module is directly connected to the ground.

In some exemplary embodiments, the second pre-driver module drives the second power switching transistor in a low-side driver mode, the first pre-driver module drives the first power switching transistor in a high-side driver mode. Accordingly, by using the first pre-driver module to drive the first power switching transistor in a high-side driver mode to generate the pulse current for driving the laser, and by using the second pre-driver module to drive the second power switching transistor in a low-side driver mode to generate the current for pulling down, thereby improving the rising and falling waveform of the output optical pulse of the laser, so as to effectively improve the tailing phenomenon of the laser pulse.

In some exemplary embodiments, a resistance capacitance time constant, which is constituted by the resistance value of the adjustable resistor and the capacitance value of the first capacitor together, is not more than one-tenth of the half-wave pulse width of the first input signal. As such, the first capacitor is the capacitance of the input node in high-side driver mode, and the capacitance value of the first capacitor under different process conditions can be determined by simulation. Considering the influence of the process conditions of the Lidar chip, in order to ensure that the high-speed and high-current signals used to drive the laser can be generated under various process conditions, with reference to the capacitance value of the first capacitor determined by simulation under various process conditions and the half-wave pulse width of the first input signal, the resistance value of the adjustable resistor may be adjusted, such that the resistance capacitance time constant is not more than one-tenth of the half-wave pulse width of the first input signal, helping to ensure signal integrity over a wide range of process conditions.

In some exemplary embodiments, the Lidar is for a vehicle-mounted implementation, and the first voltage signal is a vehicle battery voltage. In practical applications such as vehicle-mounted Lidar, within a drive scheme of high-side driver mode, the first voltage signal that is used to bias the first pre-driver module, is generally accessible to the highest voltage of the on-board system, e.g. the on-board battery voltage. Affected by factors such as battery aging and power supply line aging, the voltage provided by the on-board battery to Lidar may have jitters, which may include high-frequency, low-frequency, and different frequency combinations, which may affect the conduction and shutdown of the power switching transistor, thereby interfering with the laser to generate pulsed light signals. By using the level translation module and the low-dropout linear regulator, it is achieved that the control signal and bias state of the first pre-driver module may be configured, while taking into account jitter of the first voltage signal, by using the low-dropout linear regulator to generate the second voltage signal that is coupled to the ground end of the first pre-driver module, and by using the first voltage signal to bias the first pre-driver module, thereby beneficial to achieving high-frequency jitter following, and the equivalent ground end voltage of the first pre-driver module can follow the change of the on-board battery voltage, which is conducive to ensuring the quality and stability of the high-speed and high-current signals used to drive the laser.

To the extent that the term "includes" or "including" is employed in the detailed description or the claims, it is intended to be inclusive in a manner similar to the term "comprising" as that term is interpreted when employed as a transitional word in a claim. Furthermore, to the extent that the term "or" is employed in the detailed description or claims (e.g., A or B) it is intended to mean "A or B or both." When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

While example systems, methods, and so on, have been illustrated by describing examples, and while the examples have been described in considerable detail, it is not the intention of the applicants to restrict or in any way limit scope to such detail. It is, of course, not possible to describe every conceivable combination of components or methodologies for purposes of describing the systems, methods, and so on, described herein. Additional advantages and modifications will readily appear to those skilled in the art. Therefore, the invention is not limited to the specific details, the representative apparatus, and illustrative examples shown and described. Thus, this application is intended to embrace alterations, modifications, and variations that fall within the scope of the appended claims.

Furthermore, the preceding description is not meant to limit the scope of the invention. Rather, the scope of the invention is to be determined by the appended claims and their equivalents.

The detailed embodiments provided in the present disclosure can be implemented by any one or a combination of hardware, software, firmware, or solid-state logic circuits, and can be implemented in combination with signal processing, control, and/or dedicated circuits. The equipment(s) or device(s) provided in the detailed embodiments of the present disclosure may include one or more processors (a microprocessor, a controller, a digital signal processor (DSP), an application specific integrated circuit (ASIC), a field programmable gate array (FPGA) and so on), and these processors process various computer-executable instructions to control the operations of the equipment(s) or device(s). The equipment(s) or device(s) provided in the detailed embodiments of the present disclosure may include a system bus or a data transmission system that couples various components together. The system bus may include any one of different bus structures or a combination of different bus structures, such as a memory bus or a memory controller, a peripheral bus, a universal serial bus, and/or a process or a local bus using any of a variety of bus architectures. The equipment(s) or device(s) provided in the detailed embodiments of the present disclosure may be provided separately, may also be a part of the system, or may be a part of other equipment or devices.

The detailed embodiments provided by the present disclosure may include a computer-readable storage medium or a combination with a computer-readable storage medium, such as one or more storage devices capable of providing non-transitory data storage. The computer-readable storage medium/storage device may be configured to store data, programmers and/or instructions, which when executed by the processor of the equipment(s) or device(s) provided in the present disclosure, would allow the equipment(s) or device(s) to implement related operations. The computer-readable storage medium/storage device may include one or more of the following characteristics: volatile, nonvolatile, dynamic, static, read/write, read-only, random access, sequential access, location addressability, file addressability and content addressability. In one or more exemplary embodiments, the computer-readable storage medium/storage device may be integrated into the equipment(s) or device(s) provided in the detailed embodiments of the present disclosure or belong to a public system. The computer-readable storage media/storage devices can include optical storage devices, semiconductor storage devices and/or magnetic storage devices, etc., and can also include random access memory (RAM), flash memory, read-only memory (ROM), erasable and programmable read-only memory (EPROM), electrically erasable programmable read-only memory (EEPROM), registers, hard disk, removable disk, recordable and/or rewritable compact disc (CD), digital versatile disc (DVD), large capacity storage medium device or any other form of suitable storage medium.

It will be appreciated that various of the above-disclosed embodiments and other features and functions, or alternatives or varieties thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A high-side driver method for a laser of a Lidar, comprising:
    transforming a first input signal into a second input signal between a first voltage value and a second voltage value, by a level translation module, wherein the difference by the first voltage value minus the second voltage value is a reference voltage value, the second input signal is coupled to input end of a first pre-driver module;
    stepping down a first voltage signal according to a first voltage difference to obtain a second voltage signal, by a low-dropout linear regulator, wherein the first voltage difference equals the reference voltage value, the second voltage signal is coupled to ground end of the first pre-driver module, the first voltage signal is used for biasing the first pre-driver module and the expected value of the first voltage signal is the first voltage value;
    generating a first control signal, by the first pre-driver module, wherein the first control signal is coupled to control end of a first power switching transistor, the first voltage signal is used for biasing the first power switching transistor;
    generating a pulse current for driving the laser, by the first power switching transistor,
    wherein the level translation module comprises an adjustable resistor, the adjustable resistor is coupled between the first voltage signal and input end of the first pre-driver module, resistance value of the adjustable resistor is determined based on capacitance value of a first capacitor and half-wave pulse width of the first input signal, the first capacitor is parasitic capacitor from input end of the first pre-driver module to the ground, jitter of the first voltage signal is transmitted to input end of the first pre-driver module through the adjustable resistor.

2. The high-side driver method according to claim 1, a resistance capacitance time constant, which is constituted by the resistance value of the adjustable resistor and the capacitance value of the first capacitor together, is not more than one-tenth of the half-wave pulse width of the first input signal.

3. The high-side driver method according to claim 1, the level translation module further comprises an adjustable current source, output current of the adjustable current source passes through the adjustable resistor such that voltage drop on the adjustable resistor is the reference voltage value.

4. The high-side driver method according to claim 1, further comprising,
    pulling down voltage of load end of the first power switching transistor based on the first input signal, by an active pull-down module, so as for improving rising edge and falling edge of optical pulse waveform generated by the laser.

5. The high-side driver method according to claim 4, the active pull-down module comprises a delay module, an OR logic gate, a second pre-driver module, and a second power switching transistor, wherein pulling down voltage of the load end of the first power switching transistor based on the first input signal, by the active pull-down module, comprises:
    delaying the first input signal to obtain a delayed first input signal, by the delay module;
    performing a logical OR operation on the first input signal and the delayed first input signal to obtain a third input signal, by the OR logic gate, wherein the third input signal is coupled to input end of the second pre-driver module, the bias voltage for the second pre-driver module is the reference voltage value, ground end of the second pre-driver module is directly connected to the ground;
    generating a second control signal, by the second pre-driver module, wherein the second control signal is coupled to control end of a second power switching transistor, the voltage of the load end of the first power switching transistor is used for biasing the second power switching transistor;
    generating a current for pulling down the voltage of the load end of the first power switching transistor, by the second power switching transistor, wherein the type of the second power switching transistor is opposite to the type of the first power switching transistor.

6. The high-side driver method according to claim 5, the second pre-driver module drives the second power switching transistor in a low-side driver mode, the first pre-driver module drives the first power switching transistor in a high-side driver mode.

7. The high-side driver method according to claim 5, when the first power switching transistor is an N-type transistor, the second power switching transistor is a P-type transistor, or, when the first power switching transistor is a P-type transistor, the second power switching transistor is an N-type transistor.

8. The high-side driver method according to claim 1, wherein the reference voltage value is maximum tolerable voltage difference of the first power switching transistor.

9. The high-side driver method according to claim 1, wherein the Lidar is for a vehicle-mounted implementation, and the first voltage signal is a vehicle battery voltage.

10. The high-side driver method according to claim 1, wherein the first power switching transistor is a P-type LDMOS or an N-type LDMOS.

11. The high-side driver method according to claim 1, wherein the first power switching transistor is a non-GaN device and is manufacturable by BCD technology.

12. A high-side driver device for a laser of a Lidar, comprising:
   a pulse signal receiver, for receiving an input pulse signal so as to generate a first input signal;
   a level translation module, for transforming the first input signal into a second input signal between a first voltage value and a second voltage value, wherein the difference by the first voltage value minus the second voltage value is a reference voltage value, the second input signal is coupled to input end of a first pre-driver module;
   a low-dropout linear regulator, for stepping down a first voltage signal according to a first voltage difference to obtain a second voltage signal, wherein the first voltage difference equals the reference voltage value, the second voltage signal is coupled to ground end of the first pre-driver module, the first voltage signal is used for biasing the first pre-driver module and the expected value of the first voltage signal is the first voltage value;
   the first pre-driver module, for generating a first control signal, wherein the first control signal is coupled to control end of a first power switching transistor, the first voltage signal is used for biasing the first power switching transistor;
   the first power switching transistor, for generating a pulse current for driving the laser,
   wherein the level translation module comprises an adjustable resistor, the adjustable resistor is coupled between the first voltage signal and input end of the first pre-driver module, resistance value of the adjustable resistor is determined based on capacitance value of a first capacitor and half-wave pulse width of the first input signal, the first capacitor is parasitic capacitor from input end of the first pre-driver module to the ground, jitter of the first voltage signal is transmitted to input end of the first pre-driver module through the adjustable resistor.

13. The high-side driver device according to claim 12, further comprising an active pull-down module, wherein the active pull-down module is configured for: pulling down voltage of load end of the first power switching transistor based on the first input signal, so as for improving rising edge and falling edge of optical pulse waveform generated by the laser.

14. The high-side driver device according to claim 13, the active pull-down module comprises a delay module, an OR logic gate, a second pre-driver module, and a second power switching transistor, wherein the delay module is configured for delaying the first input signal to obtain a delayed first input signal, the OR logic gate is configured for performing a logical OR operation on the first input signal and the delayed first input signal to obtain a third input signal, the third input signal is coupled to input end of the second pre-driver module, the bias voltage for the second pre-driver module is the reference voltage value, ground end of the second pre-driver module is directly connected to the ground, the second pre-driver module is configured for generating a second control signal, the second control signal is coupled to control end of a second power switching transistor, the voltage of the load end of the first power switching transistor is used for biasing the second power switching transistor, the second power switching transistor is configured for generating a current for pulling down the voltage of the load end of the first power switching transistor, the type of the second power switching transistor is opposite to the type of the first power switching transistor.

15. A Lidar, the Lidar comprises a laser and a high-side driver device for the laser, the high-side driver device comprising:
   a pulse signal receiver, for receiving an input pulse signal so as to generate a first input signal;
   a level translation module, for transforming the first input signal into a second input signal between a first voltage value and a second voltage value, wherein the difference by the first voltage value minus the second voltage value is a reference voltage value, the second input signal is coupled to input end of a first pre-driver module;
   a low-dropout linear regulator, for stepping down a first voltage signal according to a first voltage difference to obtain a second voltage signal, wherein the first voltage difference equals the reference voltage value, the second voltage signal is coupled to ground end of the first pre-driver module, the first voltage signal is used for biasing the first pre-driver module and the expected value of the first voltage signal is the first voltage value;
   the first pre-driver module, for generating a first control signal, wherein the first control signal is coupled to control end of a first power switching transistor, the first voltage signal is used for biasing the first power switching transistor;
   the first power switching transistor, for generating a pulse current for driving the laser,
   wherein the level translation module comprises an adjustable resistor, the adjustable resistor is coupled between the first voltage signal and input end of the first pre-driver module, resistance value of the adjustable resistor is determined based on capacitance value of a first capacitor and half-wave pulse width of the first input signal, the first capacitor is parasitic capacitor from input end of the first pre-driver module to the ground, jitter of the first voltage signal is transmitted to input end of the first pre-driver module through the adjustable resistor.

16. The Lidar according to claim 15, the high-side driver device further comprises an active pull-down module, wherein the active pull-down module is configured for: pulling down voltage of load end of the first power switching transistor based on the first input signal, so as for improving rising edge and falling edge of optical pulse waveform generated by the laser.

17. The Lidar according to claim 16, the active pull-down module comprises a delay module, an OR logic gate, a second pre-driver module, and a second power switching transistor, wherein the delay module is configured for delaying the first input signal to obtain a delayed first input signal, the OR logic gate is configured for performing a logical OR operation on the first input signal and the delayed first input signal to obtain a third input signal, the third input signal is coupled to input end of the second pre-driver module, the bias voltage for the second pre-driver module is the reference voltage value, ground end of the second pre-driver module is directly connected to the ground, the second pre-driver module is configured for generating a second control signal, the second control signal is coupled to control end of a second power switching transistor, the voltage of the load end of the first power switching transistor is used for biasing the second power switching transistor, the second power switching transistor is configured for generating a current for pulling down the voltage of the load end of the first power switching transistor, the type of the second power switching transistor is opposite to the type of the first power switching transistor.

18. The Lidar according to claim 17, the second pre-driver module drives the second power switching transistor in a low-side driver mode, the first pre-driver module drives the first power switching transistor in a high-side driver mode.

19. The Lidar according to claim 15, a resistance capacitance time constant, which is constituted by the resistance value of the adjustable resistor and the capacitance value of the first capacitor together, is not more than one-tenth of the half-wave pulse width of the first input signal.

20. The Lidar according to claim 15, wherein the Lidar is for a vehicle-mounted implementation, and the first voltage signal is a vehicle battery voltage.

* * * * *